US006183330B1

(12) United States Patent
Peterson et al.

(10) Patent No.: US 6,183,330 B1
(45) Date of Patent: Feb. 6, 2001

(54) DISPLAY DEVICE AND METHOD THEREFOR

(75) Inventors: Francis Peterson, Prescott; David Walsh, River Falls, both of WI (US)

(73) Assignee: Phillips Plastics Corporation, Prescott, WI (US)

( * ) Notice: Under 35 U.S.C. 154(b), the term of this patent shall be extended for 0 days.

(21) Appl. No.: 09/333,217

(22) Filed: Jun. 15, 1999

Related U.S. Application Data

(62) Division of application No. 08/847,197, filed on May 1, 1997.

(51) Int. Cl.⁷ .................................................. H05B 33/10
(52) U.S. Cl. .................................................. 445/24
(58) Field of Search ..................... 313/503–509; 445/24

(56) References Cited

U.S. PATENT DOCUMENTS

| | | | |
|---|---|---|---|
| 3,519,871 | * 7/1970 | Kanie | 313/494 |
| 4,831,504 | 5/1989 | Nishizawa et al. | 362/100 |
| 5,127,626 | 7/1992 | Hilal et al. . | |
| 5,336,345 | * 8/1994 | Gustafson et al. | 313/509 |
| 5,364,372 | 11/1994 | Danks et al. . | |
| 5,538,509 | 7/1996 | Dunlap et al. . | |
| 5,545,150 | 8/1996 | Danks et al. . | |
| 5,565,733 | * 10/1996 | Krafcik et al. | 313/510 |
| 5,574,327 | 11/1996 | Cammack et al. | 313/110 |
| 5,580,344 | 12/1996 | Hasson . | |
| 5,634,937 | 6/1997 | Mollenauer et al. . | |
| 5,652,395 | * 7/1997 | Hirano et al. | 73/849 |
| 6,054,809 | 4/2000 | Haynes et al. | 313/505 |

FOREIGN PATENT DOCUMENTS

| | | |
|---|---|---|
| 3802317 | * 8/1989 | (DE) . |
| 38 02 317 | 8/1989 | (DE) . |
| 0 302 463 | 2/1989 | (EP) . |
| 0 334 799 | 9/1989 | (EP) . |
| 06104087 | 4/1994 | (JP) . |
| 104087 | * 4/1994 | (JP) . |
| WO 94/14180 | 6/1994 | (WO) . |

* cited by examiner

*Primary Examiner*—Kenneth J. Ramsey
(74) *Attorney, Agent, or Firm*—McDermott, Will & Emery

(57) ABSTRACT

An electroluminescent display includes thin conductive strips on a phosphor-deposited area. One aspect of the invention is directed to a device including a dielectric carrier supporting a first conductive bus connecting to first conductors and a second conductive bus connecting to second conductors. The first and second conductors are arranged in close proximity to one another, so that a phosphor-based carrier can be located therebetween and thereover to permit an electric field set up by a voltage applied between the first and second conductors to generate light via the phosphor. The device can be incorporated into a circuit board, integrated circuit or other contoured parts.

3 Claims, 7 Drawing Sheets

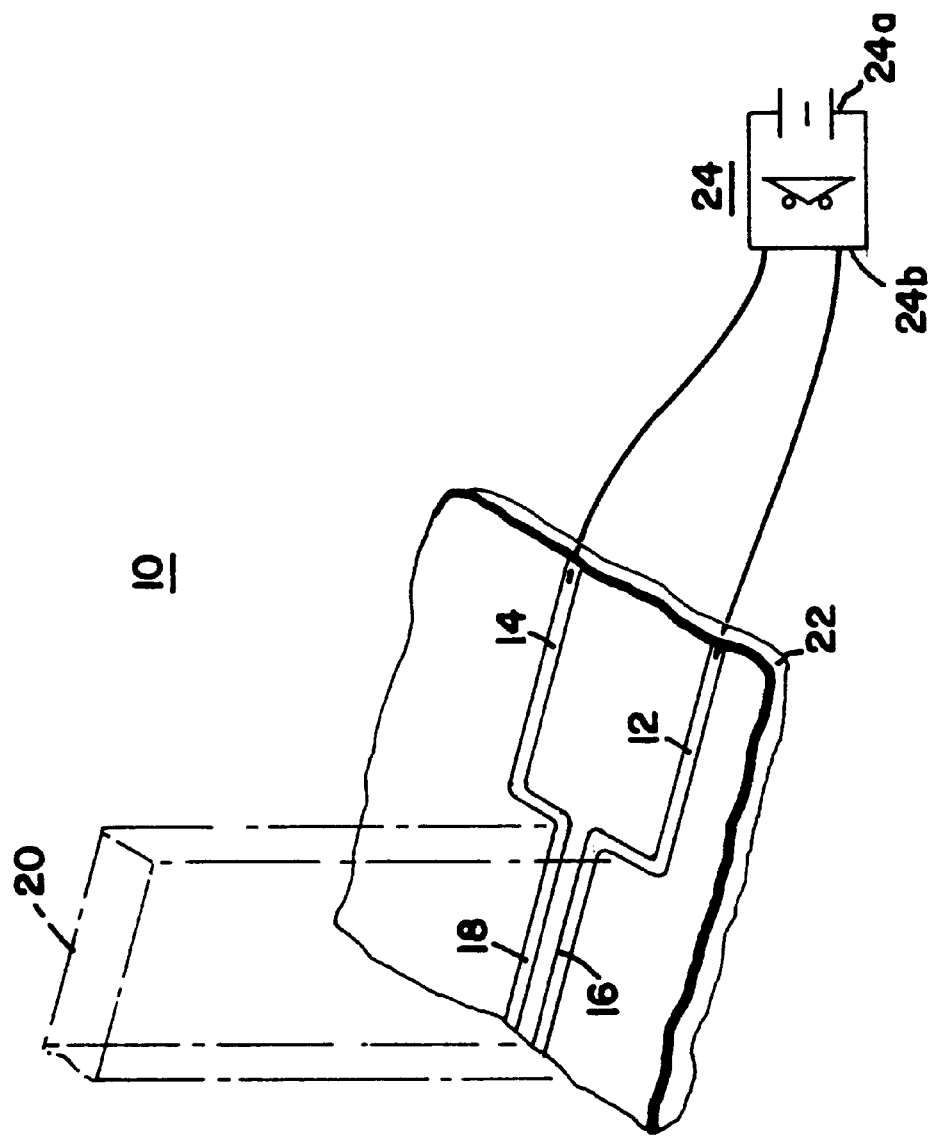

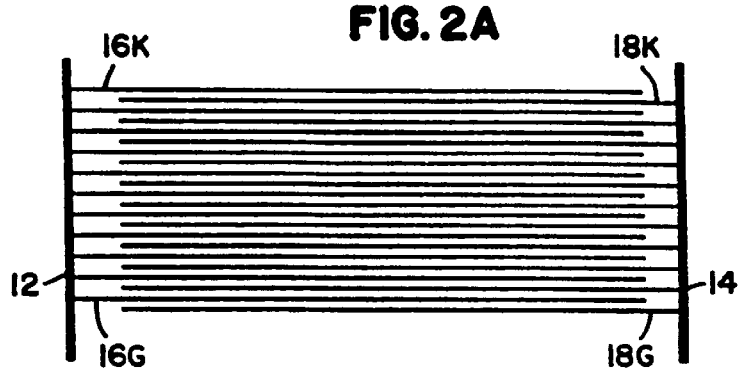
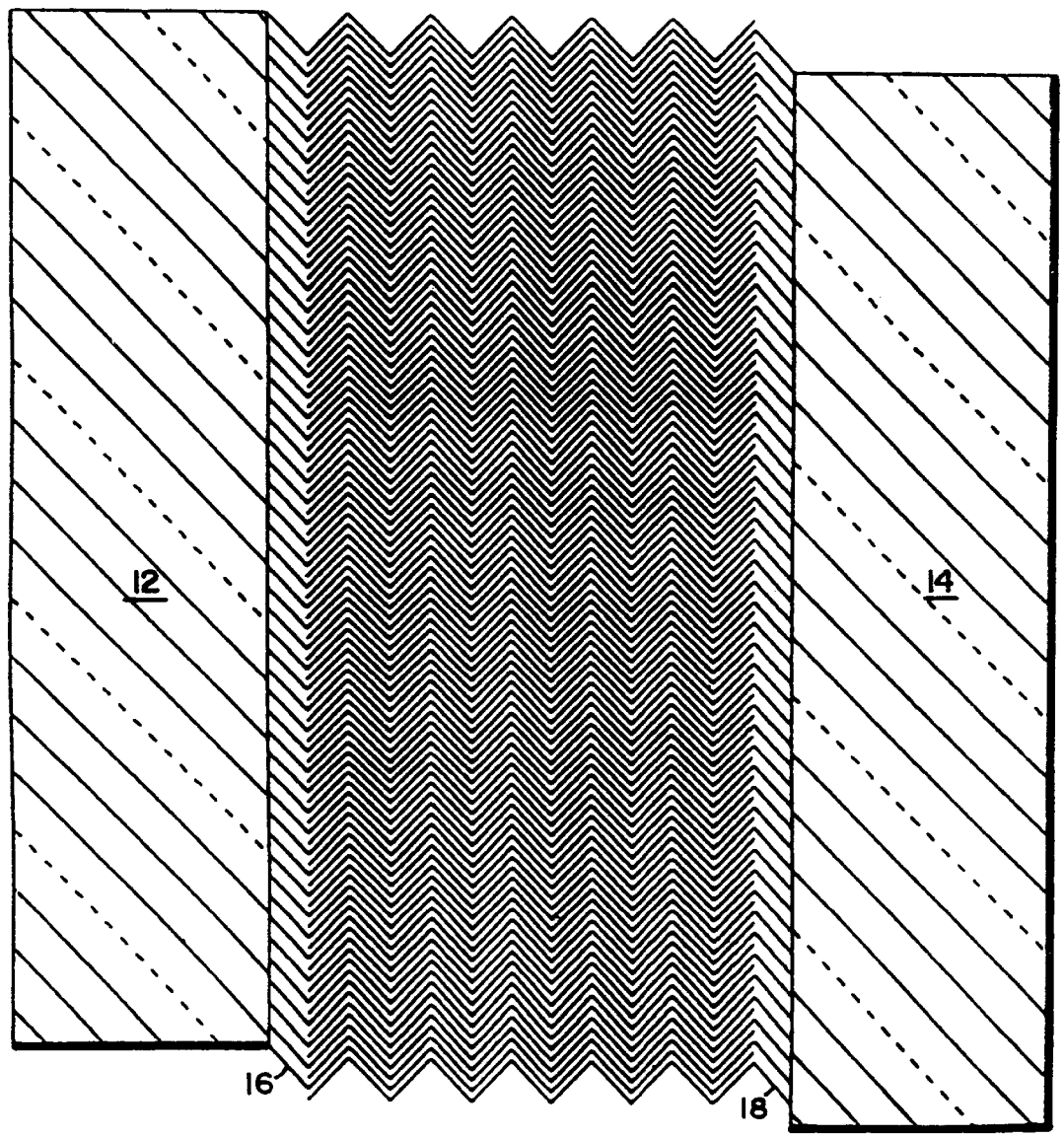

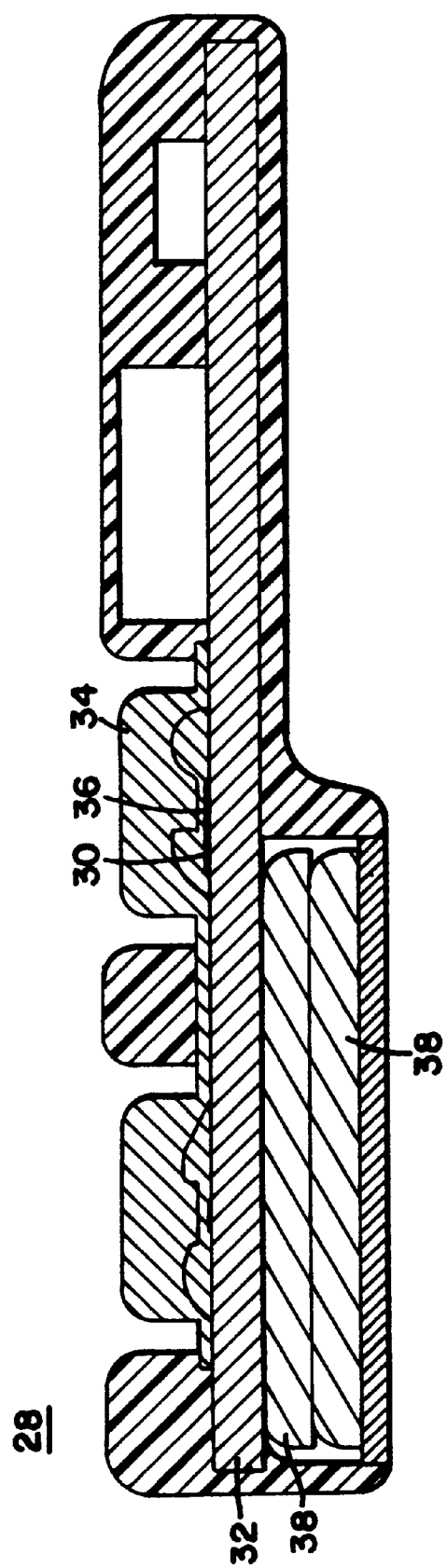

DISPLAY DEVICE AND METHOD THEREFOR

This application is a divisional of U.S. Ser. No. 08/847,197, filed on May 1, 1997 and assigned to the assignee of the present invention.

FIELD OF THE INVENTION

The present invention relates to electronically-controlled displays that can be manufactured as parts of other functional structures. More particularly, the present invention relates to electronic displays, including electroluminescent displays, that can be manufactured as parts of other functional structures.

BACKGROUND OF THE INVENTION

Displays are implemented using a variety of technology areas for use in a wide variety of applications. The technology areas span from the cathode ray tube (CRT), to various field emission display technologies, to light-emitting diode technologies, etc. The uses and applications of displays are without limit. For example, consider some display devices, such as with alphanumeric displays and computer-type display screens, whose primary purpose is to display information, and other display devices that serve secondary functions, such as backlighting user access points or controls. For many of these applications, the size and manufacturability of the display devices are major concerns.

As an example, electroluminescence is one of several popular display technologies that have been used in view of size constraints. Common uses of electroluminescence include, among other uses, backlighting watches and display screens in certain laptop and notebook computers. Electroluminescence technology is conventionally implemented using phosphor material sandwiched between two conductive layers. One of the conductive layers is typically a transparent material, such as mylar, that is coated with a transparent conductor, such as indium tin oxide. When a high voltage of alternating polarity is applied to the respective conductive layers, an electric field is created that excites the phosphor.

Manufacturing devices using displays of this type are cumbersome. In the design of a typical application, at least a three-layer electroluminescent display structure is cooperatively arranged nearby another circuit. This neighboring circuit is arranged to avoid blocking the electroluminescent light, and the electroluminescent display structure is arranged to avoid interfering with the functionality of the neighboring circuit. For many applications, especially those requiring significant generation of light in compact areas, this cooperative arrangement is not practicable.

Accordingly, many applications require displays that can be implemented in small areas while avoiding the disadvantages discussed above.

SUMMARY OF THE INVENTION

One aspect of the present invention is directed to an electroluminescent display device. The display device includes first and second conductive buses adjacent to a phosphor-based carrier on a dielectric carrier. The first and second conductive buses have at least one first conductor and at least one second conductor, respectively. These conductors are arranged in close proximity to one another, and they are secured over and supported by the dielectric carrier. The phosphor-based carrier, which includes phosphor, is located proximate to the first and second conductors to permit an electric field set up by a voltage applied between the first and second conductors to generate light via the phosphors.

Another aspect of the present invention is directed to a method for manufacturing the above-described electroluminescent display device. According to one embodiment, the method provides the manufacture of a electroluminescent display device on a dielectric carrier. The method includes: applying a first conductive bus having at least one first conductor, and a second conductive bus having at least one second conductor, arranged in close proximity to said at least one first conductor, over the dielectric carrier and forming at least one area therebetween; and depositing a phosphor-based carrier in said at least one area between the first and second conductors, the first and second conductors arranged to excite the phosphors and generate light therefrom.

The above summary of the present invention is not intended to describe each disclosed embodiment, or every implementation, of the present invention. This is the purpose of the figures and the detailed description which follow.

BRIEF DESCRIPTION OF THE DRAWINGS

Other aspects and advantages of the invention will become apparent upon reading the following detailed description and upon reference to the drawings, in which:

FIG. 1 is an exaggerated, perspective view of an electroluminescent display device, according to one embodiment of the present invention;

FIGS. 2a, 2b, 2c and 2d illustrate respective top views of three different conductor layouts for exciting phosphor in an electroluminescent display device, and FIG. 2d illustrates a perspective view of another conductor layout for exciting phosphor in an electroluminescent display device, each of the respective layouts being in accordance with the present invention;

FIG. 3 is a side view of a backlit remote control device, according to a particular application and embodiment of the present invention, employing an electroluminescent display consistent with the illustration of FIG. 1;

Figure 2C:
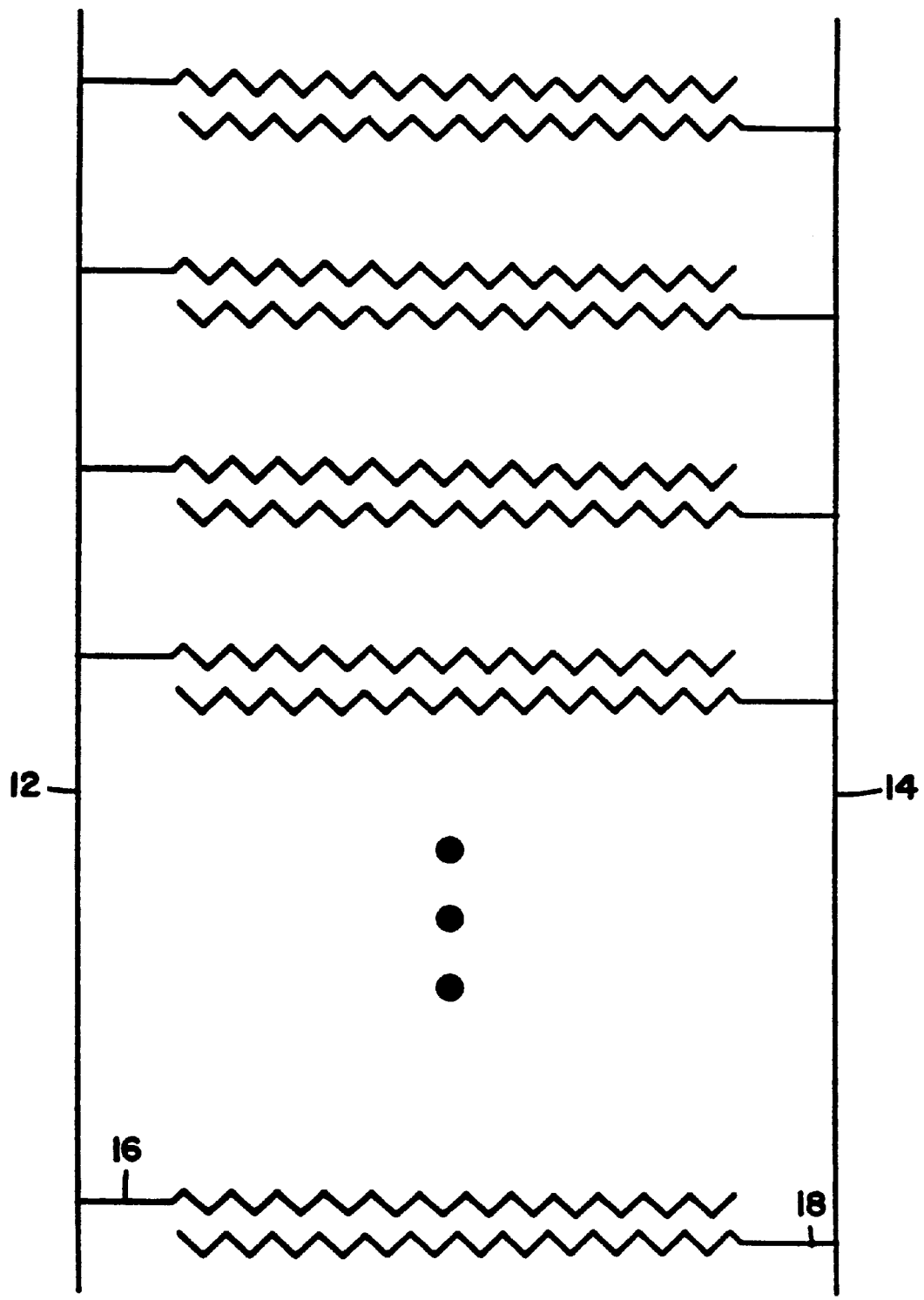

While the invention is susceptible to various modifications and alternative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION

The present invention is believed to be useful for a variety of applications requiring or benefiting from display devices that can be implemented in relatively small areas. While the present invention is not intended to be so limited, an appreciation of the present invention is best obtained through a discussion of particular example applications, including an electroluminescent display device constructed in accordance with a particular embodiment of the present invention.

One important aspect of the present invention is directed to the implementation of devices including an electroluminescent display, for example, as illustrated in the exaggerated, perspective view of the display construction 10 of FIG. 1. The display construction 10 includes first and second conductive buses 12 and 14 including respective first and second display runners or conductors 16 and 18. By locating the conductors 16 and 18 in close proximity to one another and disposing a phosphor-based carrier 20 between the two conductors 16 and 18, a conventional electroluminescent inverter circuit 24 can be connected across the two buses 12 and 14 to set up an electric field and generate light via the phosphor material in the carrier. In the particular example illustrated, the display generates light along a single line between the conductors 16 and 18. It will be understood that the "buses" may be as illustrated as a wider portion of the conductor extending from the inverter terminal or may be constructed and arranged as merely an indistinguishable and continuous part of the conductor(s) emanating therefrom.

By extending the phosphor-based carrier 20 so that it resides between other conductors and/or between the bus conductors 12 and 14, displays in non-linear shapes and different sizes can be realized. As illustrated in the embodiment of FIG. 2a, for example, the conductors 16 and 18 of FIG. 1 are respectively replaced or supplemented by a plurality of first conductors 16a through 16k and a plurality of second conductors 18a through 18k. The conductors 16a through 16k are interleaved with the second conductors 18a through 18k, to create a multitude (eleven in the example illustration) of phosphor-energizable areas, one such area in the proximity of each opposing pair (e.g., 16a and 18a) of conductors. FIG. 2b provides another example configuration wherein the bus conductors 12 and 14 are widened to increase the current-carrying capability of the buses and wherein the conductors, generally designated as 16 and 18, are interleaved and aligned in a zig-zag pattern for an esthetically-specific display application. Other shapes, including, but not limited to, curvilinear and non-linear shapes, can also be implemented as supplements or alternatives to the above conductor constructions.

According to another important aspect of the present invention, FIG. 2c illustrates a configuration wherein the conductors 16 and 18 are serrated to form energy-generating tips. As the polarity of the energy between opposing conductors changes, the changing E-field at the opposing tips is concentrated, thereby enhancing brightness. For enhanced lighting generated at the phosphor-energizable areas defined by the opposing conductors, the frequency of the tips per unit of linear measure is increased.

Figure 2D:
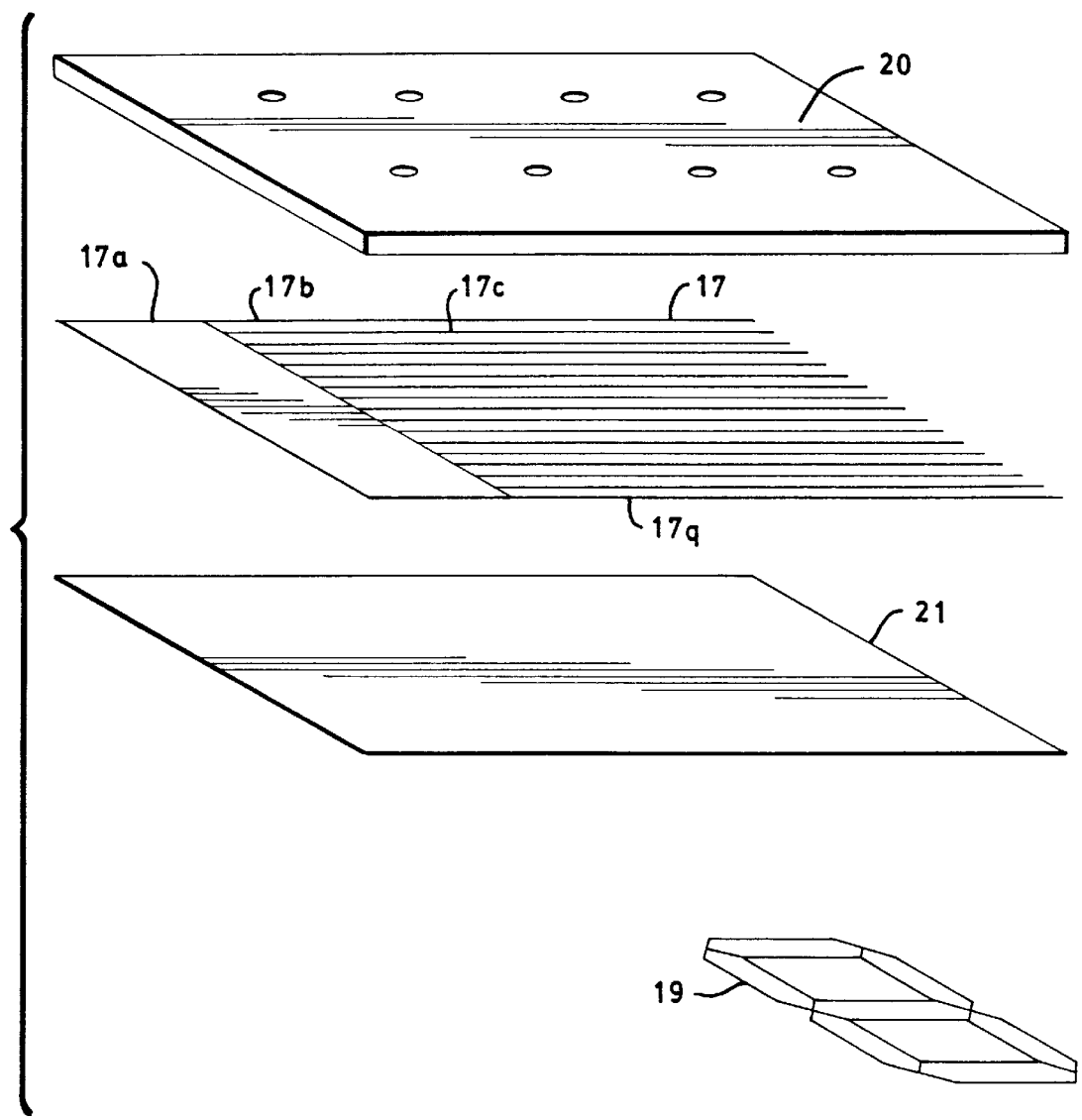

According to yet another important aspect of the present invention, FIG. 2d illustrates a configuration wherein a fingered conductor 17 and a polarity-opposing graphic conductor 19 are separated by a dielectric 21, such as a thin sheet of mylar. The conductor 17 is covered by (or, alternatively, covers) a layer of phosphor-based material 20. The conductor 17, which may include a finger-extending bus portion 17a, includes separated fingers 17b–17q arranged over the graphic conductor 19. As the polarity of the energy between the conductors 17 and 19 changes, the changing E-field at the opposing tips illuminates the shape of the graphic conductor 19 on the side of the clear dielectric 21 carrying the conductor 17. The conductors 17, 19 and the phosphor-based material may be applied as described herein in connection with FIGS. 2a, 2b and 2c.

In a more specific embodiment consistent with the approach of FIG. 2d, the graphic conductor 19 is implemented as separated conductors with each separated conductor carrying the opposing charge in an alternative manner. A control circuit, such as a programmed microprocessor and selectable encoder (or functional equivalent such as an ASIC), passes the opposing charge to each of the separated conductors to illuminate selected portions of the desired graphic display.

Among other benefits and advantages, these above-disclosed embodiments permit a relatively inexpensive and straightforward manufacture of displays on any of a variety of dielectric carriers 22 and, where beneficial, as an integral part of other functional devices. Referring to FIG. 3, for example, a battery-operated remote control 28 includes, as integral parts, an electronic display 30, such as illustrated above, and a conventional switch circuit. The electronic display 30 is printed on the control-access side of a printed circuit board (PCB) 32. The PCB 32 carries conventional components (not shown in FIG. 3) including circuit-connecting conductors, a signal transmitter, and a control circuit. The switch circuit includes a conductor-carrying depressor 34 opposite the PCB 32 and wire-terminating contacts 36 on the PCB adjacent the electronic display 30. The depressor 34 includes at least a portion that is transparent to permit passage of light generated by the electronic display. The electroluminescent inverter is optionally arranged as part of the control circuit carried by the PCB 32.

A battery circuit 24a is used, selectively or as required, to energize the electroluminescent inverter (24b of FIG. 3). For example, upon first engagement of any of the depressors of the remote control device, the control circuit switches power on to the electroluminescent inverter and maintains such power for a predetermined period of time to permit the user to distinguish the keys from one another. In this mode, the control circuit includes a conventional firmware- or hardware-implemented debounce circuit to prevent erroneous readings of the switches as can be caused by the user inadvertently striking the same switch repeatedly or multiple switches at about the same time.

Figure 4:
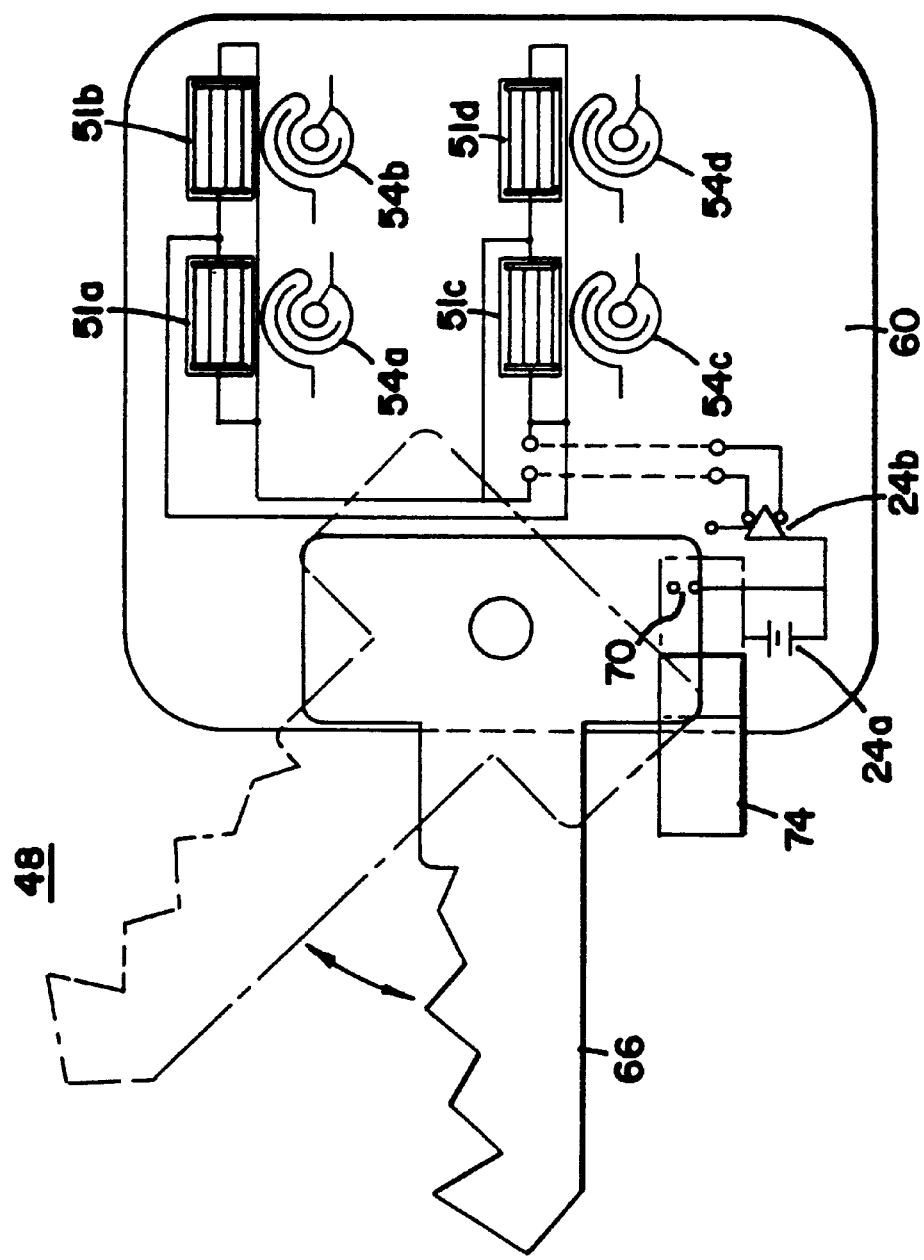
FIG. 4 is a top view of an electroluminescent display arranged as part of a combination key and integrated circuit, according to a particular application and embodiment of the present invention.

FIG. 4 illustrates a battery-operated remote control key device 48 with integral parts including electronic displays 51a, 51b, 51c and 51d for backlighting associated switch circuits, the wire-terminating contacts of which are designated as 54a, 54b, 54c and 54d. Each of the electronic displays 51a, 51b, 51c and 51d are implemented on the surface side of an integrated-circuit (chip) and configured, for example, as indicated above in connection with FIG. 2a, 2b or 2c.

The battery circuit 24a for this implementation can be used selectively in response to engagement of a mechanical conductor. For example, rotation of the metallic portion 66 of the key device 48 can be used to short a pair of terminals 70 and, in turn, inform the control circuit 60 that the electroluminescent inverter 24b is to be energized for a predetermined period of time. Alternatively, a user can depress conductive, friction-fitting, slidable post 74 to provide the same input as rotating the key of the control circuit 60. As another alternative, or in addition, first engagement of any of the depressor portions of the switch circuit can inform the control circuit of the need to energize for the designated period of time, as described above in connection with FIG. 3.

Figure 5:
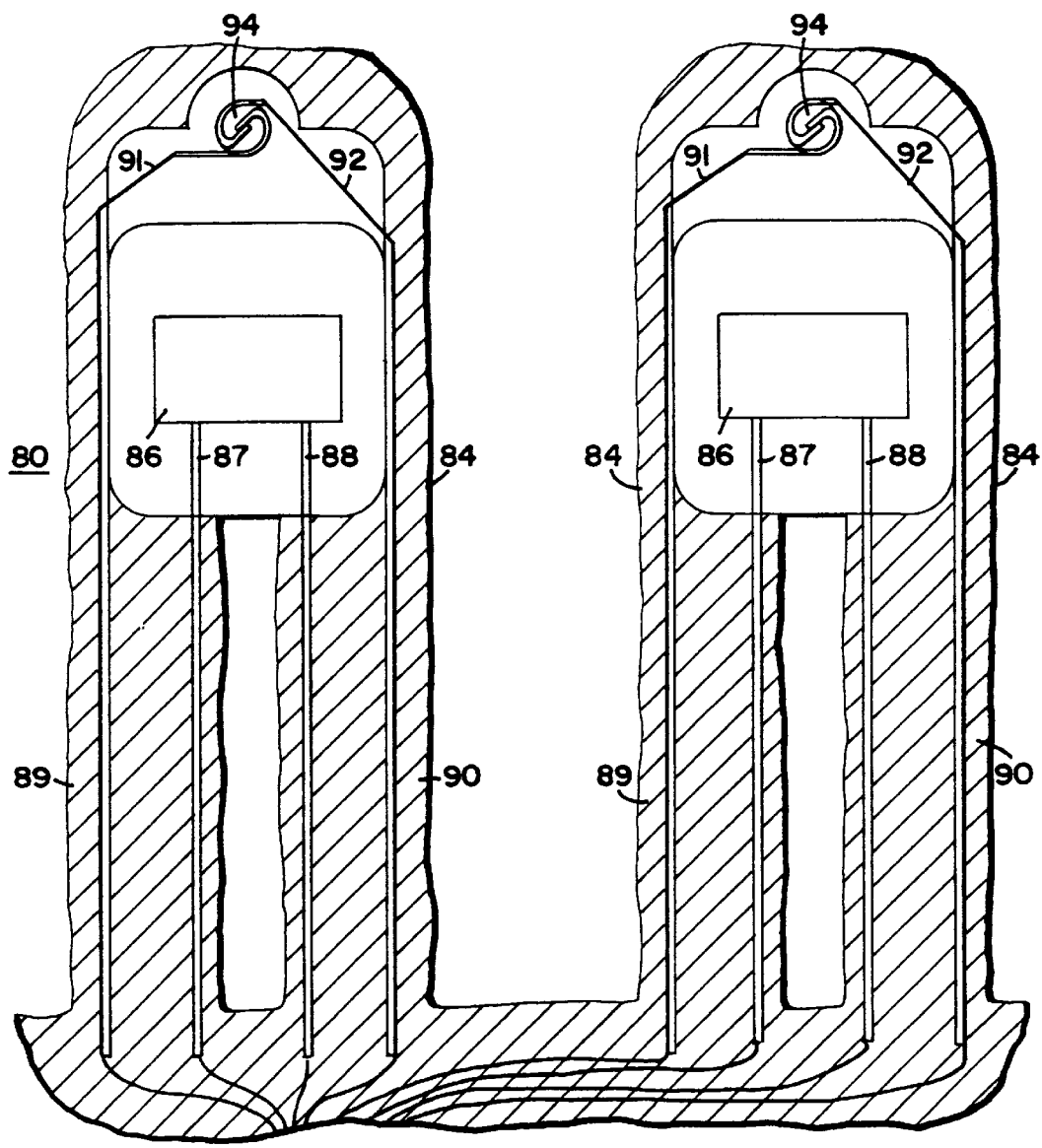
FIG. 5 is a view of a backlit button configured as part of a set of buttons and an employing electroluminescent display consistent with the illustration of FIG. 1, all of which is in accordance with a particular application and embodiment of the present invention.

FIG. 5 illustrates a portion of another remote control device having a plurality of hinged depressors 84 arranged in parallel and as part of an overall molded plastic unit 80. The remote control device of FIG. 5 is similar to the device of FIG. 4 in terms of the display and switch construction and general electrical operation. The remote control device of FIG. 5, however, includes an electroluminescent display 86 driven remotely from a control circuit having a driver providing (not shown in FIG. 5) energy to buses 87 and 88. These buses 87 and 88 are printed as conductive strips along two arms 89 and 90 of the molded plastic unit 80. The two arms 89 and 90 also carry buses 91 and 92 which connect to terminal ends 94 of a conventional switch circuit. In addition to carrying the buses (or conductors) to a control circuit terminal 96, the two arms 89 and 90 serve as a hinge to permit the switch end of the molded plastic unit 80 to freely move upon engagement into the unshown conductive portion of the switch for shorting the terminal ends 94 and informing the control circuit of the engagement. The electroluminescent display 86 is activated as described above in connection with FIGS. 3 and 4 or, depending on the application, in response to another condition. For example, when used as a driver control panel in an automobile application, backlighting for depressors of the molded plastic unit 80 can be activated in response to opening the vehicle door, the keys being inserted into the ignition slot and/or engine start-up.

In each of the above remote control devices, the control circuit is implemented in a form that best suits the application. Some more sophisticated applications may require a program-based control circuit, such as a microprocessor or an ASIC (application-specific integrated circuit). For other applications, the control circuit may be implemented using conventional discrete analog and/or digital logic, such as pull-up resistors, diodes and wired-OR type circuitry. For the above implementations in which a transmitter is being used, the transmitter type may also be selected and/or designed to meet the needs of the specific application. The inverter is also application-dependent. Included among the many inverter manufacturers are Motorola and NEC.

According to yet another aspect of the present invention, the electroluminescent display is manufactured by first applying the display conductors along with the switch conductors and buses where applicable. This is accomplished, e.g., by screen printing the conductors on, or etch-removing a previously-applied conductive layer from, a dielectric surface. The dielectric surface may be any of a number of different types of substantially nonconducting surfaces, including but not limited to the protective housing of an IC, mylar, paper or virtually any type of plastic. Over the conductors, a phosphor-based carrier is deposited so as to cover the area or areas between the first and second conductors carrying the drive signals from the electroluminescent inverter. Alternatively, the phosphor-based carrier is deposited first, followed by application of the conductors.

The plastic components, for example, used as supportive outer housings for the structures of FIGS. 3–5, are manufactured using conventional techniques. One such technique involves applying any needed graphics to the exposed side of a sheet of mylar, securing the conductors to the back side of the mylar as described above, forming the mylar as required by the application, cutting away and discarding the unused portion of the mylar, placing the remaining portion of the mylar into a mold and injecting plastic into the mold and onto the back side of the mylar.

It will be apparent to those skilled in the art that various modifications and variations can be made to the embodiments illustrated herein without departing from the scope or spirit of the invention. Such modifications and variations do not depart from the true scope and spirit of the invention which is set forth by the following claims.

What is claimed is:

1. A method for manufacturing an electroluminescent display device on a dielectric carrier having first and second opposing sides comprising:

applying a first conductive bus having at least one first conductor to a first side of the dielectric carrier and a second conductive bus having at least one second conductor to a second side of the dielectric carrier; and depositing a phosphor-based carrier on the first side of the dielectric carrier in the proximity of the at least one first conductor to permit an electric field set up by a voltage applied between the first and second conductors to excite the phosphor and generate light on the first side of the dielectric carrier, wherein the step of applying the first conductive bus includes applying a plurality of first conductors arranged in a pattern and forming areas between the first conductors.

2. A method for manufacturing an electroluminescent display device on a dielectric carrier according to claim 1, wherein the step of applying the first and second conductors onto respective first and second opposing sides of the dielectric carrier includes the step of screen printing.

3. A method for manufacturing an electroluminescent display device on a dielectric carrier according to claim 1, wherein the step of applying includes the step of removing conductive material from a previously-applied conductor.

\* \* \* \* \*